United States Patent
Chang et al.

(10) Patent No.: US 9,859,156 B2
(45) Date of Patent: Jan. 2, 2018

(54) INTERCONNECTION STRUCTURE WITH SIDEWALL DIELECTRIC PROTECTION LAYER

(71) Applicant: TAIWAN SEMICONDUCTOR MANUFACTURING CO., LTD., Hsinchu (TW)

(72) Inventors: Che-Cheng Chang, New Taipei (TW); Chih-Han Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/985,157

(22) Filed: Dec. 30, 2015

(65) Prior Publication Data

US 2017/0194247 A1 Jul. 6, 2017

(51) Int. Cl.
*H01L 23/52* (2006.01)
*H01L 21/768* (2006.01)
*H01L 23/532* (2006.01)
*H01L 23/485* (2006.01)

(52) U.S. Cl.
CPC .... *H01L 21/7685* (2013.01); *H01L 21/76805* (2013.01); *H01L 21/76832* (2013.01); *H01L 21/76877* (2013.01); *H01L 23/485* (2013.01); *H01L 23/5329* (2013.01); *H01L 23/53295* (2013.01)

(58) Field of Classification Search
CPC ............. H01L 23/5226; H01L 23/528; H01L 23/5329
See application file for complete search history.

(56) References Cited

U.S. PATENT DOCUMENTS

| 6,040,243 | A | * | 3/2000 | Li | H01L 21/76805 257/E21.579 |
| 6,358,842 | B1 | * | 3/2002 | Zhou | H01L 21/31138 257/E21.256 |
| 6,465,888 | B2 | * | 10/2002 | Chooi | H01L 21/76807 257/751 |
| 6,518,166 | B1 | * | 2/2003 | Chen | H01L 21/76808 257/E21.271 |
| 6,660,630 | B1 | * | 12/2003 | Chang | H01L 21/76808 257/E21.578 |
| 6,689,684 | B1 | * | 2/2004 | You | H01L 21/76804 257/E21.577 |

(Continued)

FOREIGN PATENT DOCUMENTS

| KR | 20040063299 A | * | 7/2004 |
| KR | 20040077307 A | * | 9/2004 |

*Primary Examiner* — Ida M Soward
(74) *Attorney, Agent, or Firm* — Maschoff Brennan

(57) ABSTRACT

An interconnection structure includes a non-insulator structure, a dielectric structure, a conductive structure and a first dielectric protective layer. The dielectric structure is present on the non-insulator structure. The dielectric structure has a trench opening and a via opening therein. The via opening is present between the trench opening and the non-insulator structure. The conductive structure is present in the trench opening and the via opening and electrically connected to the non-insulator structure. The first dielectric protective layer is present between the conductive structure and at least one sidewall of the trench opening.

20 Claims, 7 Drawing Sheets

(56) References Cited

U.S. PATENT DOCUMENTS

| | | | | |
|---|---|---|---|---|
| 6,734,097 B2 * | 5/2004 | Iggulden | H01L 21/76807 | 257/E21.579 |
| 6,756,672 B1 * | 6/2004 | You | H01L 21/76802 | 257/637 |
| 6,812,111 B2 * | 11/2004 | Cheong | H01L 21/28114 | 257/204 |
| 6,987,321 B2 * | 1/2006 | Chooi | H01L 21/28556 | 257/751 |
| 7,192,878 B2 * | 3/2007 | Weng | H01L 21/02063 | 257/E21.229 |
| 7,199,040 B2 * | 4/2007 | Yang | H01L 21/2855 | 257/E21.584 |
| 7,271,087 B2 * | 9/2007 | Chun | H01L 21/76807 | 257/E21.579 |
| 7,338,903 B2 * | 3/2008 | Peng | H01L 21/76807 | 257/E21.226 |
| 7,402,514 B2 * | 7/2008 | Tsu | H01L 21/76831 | 257/E21.579 |
| 8,975,749 B2 * | 3/2015 | Liu | H01L 21/76831 | 257/751 |
| 9,449,837 B2 * | 9/2016 | Yu | H01L 21/31116 | |
| 9,666,520 B2 * | 5/2017 | Yu | H01L 23/36 | |
| 9,711,379 B2 * | 7/2017 | Yu | H01L 21/568 | |
| 2003/0139034 A1 * | 7/2003 | Yuang | H01L 21/76801 | 438/634 |
| 2003/0203510 A1 * | 10/2003 | Hineman | B82Y 25/00 | 438/3 |
| 2004/0038518 A1 * | 2/2004 | Chung | H01L 21/76808 | 438/631 |
| 2004/0173908 A1 | 9/2004 | Barth et al. | | |
| 2010/0224996 A1 * | 9/2010 | Cunningham | H01L 21/76805 | 257/751 |
| 2016/0365271 A1 * | 12/2016 | Chang | H01L 21/76807 | |

\* cited by examiner

INTERCONNECTION STRUCTURE WITH SIDEWALL DIELECTRIC PROTECTION LAYER

BACKGROUND

A dual damascene process is a technique for forming interconnections in semiconductor devices. As the feature sizes get smaller, the dual damascene process provides a more exact dimensional control over small geometries. Therefore, the dual damascene process is suited for ultra large scale integrated (ULSI) circuit technology where more and more devices are being packed into the same or smaller areas in a semiconductor substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
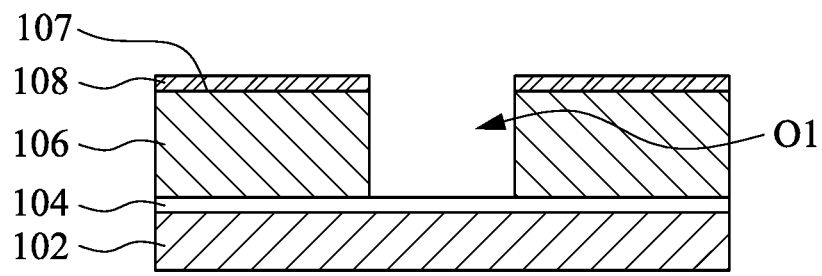
FIGS. 1 to 14 are cross-sectional views of a method for manufacturing an interconnection structure at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1 to 14 are cross-sectional views of a method for manufacturing an interconnection structure at various stages in accordance with some embodiments of the present disclosure.

Reference is made to FIG. 1. A liner layer 104 is formed on a non-insulator structure 102. The non-insulator structure 102 refers to a structure formed of one or more non-insulator materials, polysilicon, metal, conductive materials, semiconductor materials or combinations thereof. The non-insulator structure 102 can serve as a gate electrode, a source/drain region of a semiconductor device, such as a fin field effect transistor (FinFET).

In some embodiments, when the non-insulator structure 102 serves as the gate electrode of the FinFET, the non-insulator structure 102 may be formed by a gate last process. An exemplary gate last process may include forming a dummy gate structure including a material, such as polysilicon, on a semiconductor fin, forming spacers including a material, such as silicon oxide, silicon nitride, silicon oxynitride, silicon carbide, beside the dummy gate structure, removing the dummy gate structure to form a trench between the spacers, and forming at least one metal layer into the trench between the spacers to from the non-insulator structure 102. The metal layer may include a metal material suitable for forming the gate electrode or a portion thereof, including, work function layers, liner layers, interface layers, seed layers, adhesion layers, barrier layers and so on. In some embodiments, the metal layer may include suitable metal, such as TiN, WN, TaN, or Ru, which performs in a p-type FinFET. In some alternative embodiments, the metal layer may include suitable metal, such as Ti, Ag, Al, TiAl, TiAlN, TiAlC, TiAlCN, TaC, TaCN, TaSiN, Mn, or Zr, which performs in an n-type FinFET.

In some embodiments, when the non-insulator structure 102 serves as the source/drain region, an exemplary formation process may include doping an n-type dopant, such as phosphorous, or a p-type dopant, such as boron, into at least one portion of the semiconductor fin not covered by the spacers and the gate electrode by using ion implantation. Another exemplary process of forming the source/drain region may include forming at least one source/drain recess in the fin adjacent to the spacer, forming a seed layer in the source/drain recess, forming a relaxed epitaxial layer on the seed layer in the source/drain recess, forming an epitaxial layer on the relaxed epitaxial layer in the source/drain recess, so that the seed layer, the relaxed epitaxial layer and the epitaxial layer form a source/drain stressor to serve as the source/drain region. In some embodiments, the source/drain stressor includes, for example, SiP, SiP or SiCP, which is able to induce a tensile strain to the n-type channel in the semiconductor fin. In some other embodiments, the source/drain stressor includes SiGe, which is able to induce a compressive strain to the p-type channel in the semiconductor fin.

The liner layer 104 may serve as an etch stop layer, which protects the non-insulator structure 102 during an etching process for forming a via opening and/or an etching process of forming a trench opening. In some embodiments, the liner layer 104 may include a dielectric material, such as silicon carbide, silicon nitride or carbon-doped silicon nitride. In some embodiments, the liner layer 104 may include a conductive material, such as Ti, TiN, TiC, TiCN, Ta, TaN, TaC, TaCN, W, WN, WC, WCN, TiAl, TiAlN, TiAlC, or TiAlCN. In some embodiments, the liner layer 104 may be deposited using chemical vapor deposition (CVD), high density plasma (HDP) CVD, sub-atmospheric CVD (SACVD), molecular layer deposition (MLD), sputtering, physical vapor deposition (PVD), plating, or other suitable techniques. For example, in some embodiments, the MLD process is carried out under a pressure less than about 10 mTorr and in the temperature range from about 350° C. to about 500° C. In some embodiments, the silicon nitride is deposited on the top surface of the non-insulator structure 102 by reacting a silicon source compound and a nitrogen source. The silicon source compound provides silicon to the deposited silicon nitride and may include silane (SiH$_4$) or tetrathoxysilane (TEOS). The nitrogen source provides nitrogen to the deposited silicon nitride and may include ammonia (NH$_3$) or nitrogen gas (N$_2$). In some other embodiments, the carbon-doped silicon nitride is deposited on the top surface of the non-insulator structure 102 by reacting a carbon source compound, a silicon source compound, and a nitrogen source. The carbon source compound may include an organic compound, such as a hydrocarbon compound, e.g., ethylene (C$_2$H$_6$).

A first dielectric structure 106 is formed on the liner layer 104 and the non-insulator structure 102. The first dielectric structure 106 may be an interlayer dielectric (ILD) layer that includes a dielectric material. The dielectric material may include tetrathoxysilane (TEOS), an extreme low-k (ELK) dielectric material, nitrogen-free anti-reflective coating (NFARC), silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), Xerogel, Aerogel, amorphous fluorinated carbon, Parylene, BCB (bis-benzocyclobutenes), polyimide, and/or combinations thereof. The ELK dielectric material has a dielectric constant less than, for example, about 2.5. It is understood that the first dielectric structure 106 may include one or more dielectric materials and/or one or more dielectric layers. In some embodiments, the first dielectric structure 106 may be deposited on the liner layer 104 by using, for example, CVD, HDP CVD, SACVD, spin-on, sputtering, or other suitable techniques.

A mask layer 108 may be formed on the first dielectric structure 106. The mask layer 108 has an opening. The opening of the mask layer 108 exposes a portion of the first dielectric structure 106, so that an etching process can be performed to the exposed portion of the first dielectric structure 106 to form a via opening O1 in a subsequent process. In some embodiments, the mask layer 108 may be a hard mask, such as silicon nitride (Si$_3$N$_4$), which has relatively high etching resistivity compared to the first dielectric structure 106. Formation of the hard mask includes forming a hard mask layer on the first dielectric structure 106 and then patterned to form the hard mask with the image of the via opening O1. In some other embodiments, the mask layer 108 may be a photoresist layer. Formation of the mask layer 108 includes forming a photoresist layer on the first dielectric structure 106 and then patterned to form a photoresist mask with the image of the opening of the mask layer 108.

An Etching process is performed to the portion of the first dielectric structure 106 exposed by the mask layer 108 to form a via opening O1 therein. The etching process of forming the via opening O1 is stopped by the liner layer 104, so that the via opening O1 is present on the liner layer 104 in this step. In other words, the liner layer 104 is exposed by the via opening O1. In some embodiments, the etching process may be a dry etching, wet etching and/or plasma etching process. The etching process of forming the via opening O1 may employ a mixture of tetrafluoromethane (CF$_4$), trifluoromethane (CHF$_3$) and oxygen as the etching gases.

Figure 2:
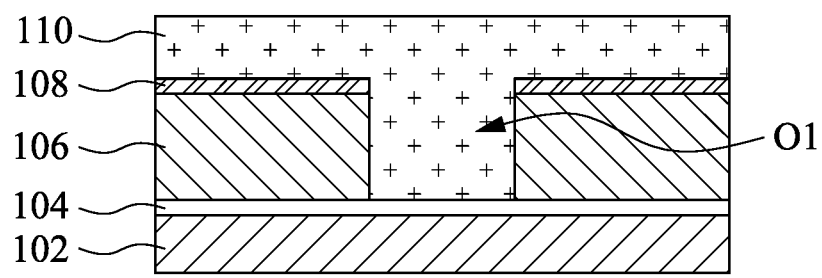

Reference is made to FIG. 2. A dummy structure 110 is at least formed in the via opening O1. More particularly, the dummy structure 110 is formed in the via opening O1 and on a top surface of the mask layer 108. In some embodiments, the dummy structure 110 and the first dielectric structure 106 have different materials such that the dummy structure 110 may be selectively etched with respect to the first dielectric structure 106 in a subsequent process. More particularly, the dummy structure 110 and the first dielectric structure 106 have different etch properties. In some embodiments, the dummy structure 110 may include photoresist or bottom antireflective coating (BARC). More particularly, the dummy structure 110 may include a material having an etch selectivity different from an etch selectivity of the first dielectric structure 106. "Etch selectivity" in this context is a ratio of an amount of an etch-target material etched away versus an amount of photoresist etched away in a single etching process. For example, the first dielectric structure 106 may include tetrathoxysilane (TEOS), an extreme low-k (ELK) dielectric material, nitrogen-free anti-reflective coating (NFARC), or silicon oxide, and the dummy structure 110 may include the material different from the first dielectric material 106, such as silicon nitride, so that the dummy structure 110 can be selectively etched with respect to the first dielectric structure 106 to leave the via opening O1 in a subsequent process. The dummy structure 110 can be formed by a deposition process, such as, the CVD process.

Figure 3:
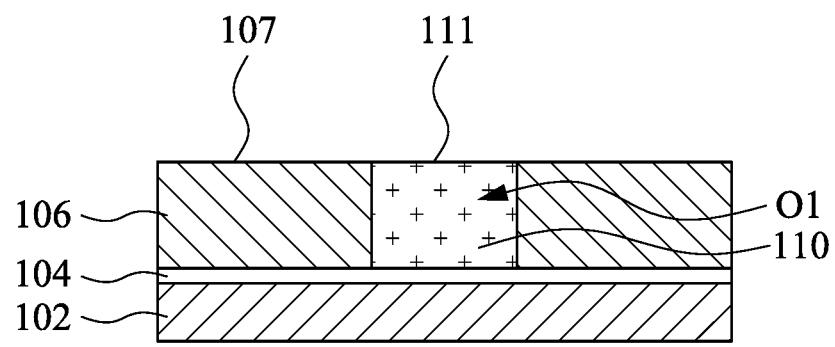

Reference is made to FIG. 3. The mask layer 108 and a portion of the dummy structure 110 overlying the mask layer 108 are removed to expose the top surface 107 of the first dielectric structure 106. After this removal process, a portion of the dummy structure 110 still remains in the via opening O1. This removal process can be implanted by, for example, a chemical-mechanical polishing (CMP) process. The CMP process removes the mask layer 108 and portions of the dummy structure 110 overlying the mask layer 108 and outside the via opening O1. The CMP process may stop when reaching the first dielectric structure 106, so as to provide a substantially planar top surface 107.

Figure 4:
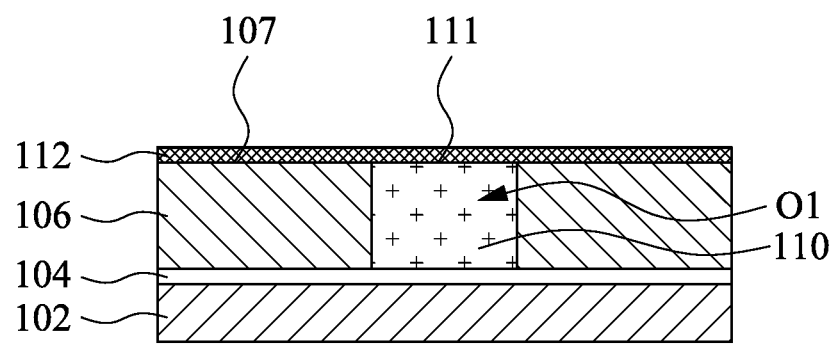

Reference is made to FIG. 4. An etch stop layer 112 is formed on the top surface 107 of the first dielectric structure 106 and a top surface 111 of the dummy structure 110. The etch stop layer 112 protects the first dielectric structure 106 against a subsequent etching process of forming a trench opening thereon. In some embodiments, the etch stop layer 112 and the first dielectric structure 106 have different etch properties, so that the etch stop layer 112 can be selectively etched with respect to the first dielectric structure 106 in a subsequent process. In some embodiments, the etch stop layer 112 may include a dielectric material, such as silicon oxynitride, silicon carbide, silicon carbon oxynitride, silicon nitride, or carbon-doped silicon nitride. In some embodiments, the etch stop layer 112 may be deposited using CVD, high density plasma (HDP) CVD, sub-atmospheric CVD (SACVD), molecular layer deposition (MLD), sputtering, physical vapor deposition (PVD), or other suitable techniques. For example, in some embodiments, the MLD process is carried out under a pressure less than about 10 mTorr and in the temperature range from about 350° C. to about 500° C. In some embodiments, the silicon nitride is deposited on the top surface 107 of the first dielectric structure 106 and the top surface 111 of the dummy structure 110 by reacting a silicon source compound and a nitrogen source. The silicon source compound provides silicon to the deposited silicon nitride and may include silane (SiH$_4$) or tetrathoxysilane (TEOS). The nitrogen source provides nitrogen to the deposited silicon nitride and may include ammonia (NH$_3$) or nitrogen gas (N$_2$). In some other embodiments, the carbon-doped silicon nitride is deposited on the top surface 107 of the first dielectric structure 106 and the top surface 111 of the dummy structure 110 by reacting a carbon source compound, a silicon source compound, and a nitrogen source. The carbon source compound may include an organic compound, such as a hydrocarbon compound, e.g., ethylene (C$_2$H$_6$).

Figure 5:
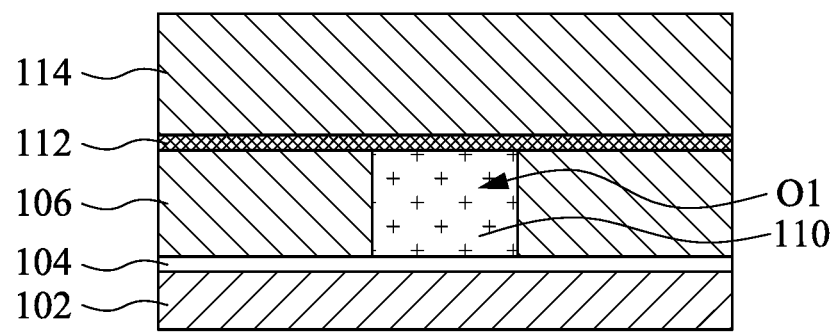

Reference is made to FIG. 5. A second dielectric structure 114 is formed on the etch stop layer 112. The second dielectric structure 114 and the etch stop layer 112 have different etch properties. In a greater detail, the second dielectric structure 114 may include a material having an etch selectivity different from the etch selectivity of the etch stop layer 112, so that the etch stop layer 112 can protect the underlying dummy structure 110 and the first dielectric structure 106 against the etching process performed to the second dielectric structure 114 in a subsequent process. For example, the second dielectric structure 114 may include tetrathoxysilane (TEOS), an extreme low-k (ELK) dielectric material, nitrogen-free anti-reflective coating (NFARC), silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), Xerogel, Aerogel, amorphous fluorinated carbon, Parylene, BCB (bis-benzocyclobutenes), polyimide, and/or combinations thereof. The ELK dielectric material has a dielectric constant less than, for example, about 2.5. It is understood that the second dielectric structure 114 may include one or more dielectric materials and/or one or more dielectric layers. In some embodiments, the second dielectric structure 114 may be deposited on the etch stop layer 112 by using, for example, CVD, HDP CVD, SACVD, spin-on, sputtering, or other suitable techniques.

Figure 6:
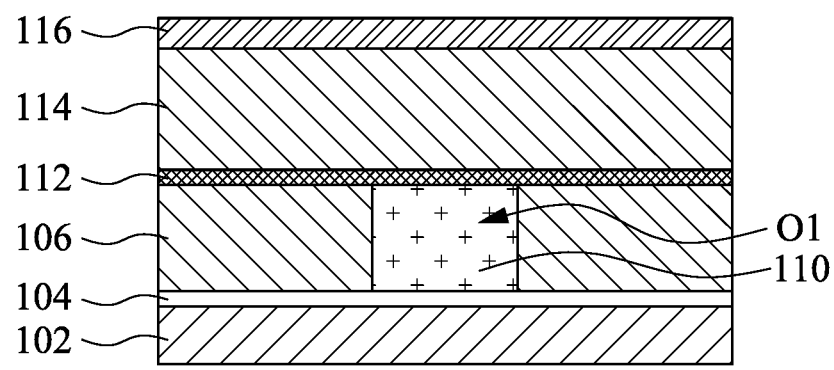

Reference is made to FIG. 6. A mask layer 116 is formed over the second dielectric layer 114. The mask layer 116 may include photoresist or other photo-sensitive materials. For example, the mask layer 116 may include the deep UV photoresist or other photoresists. The mask layer 116 may be formed by, for example, coating photoresist on the second dielectric structure 114.

Figure 7:
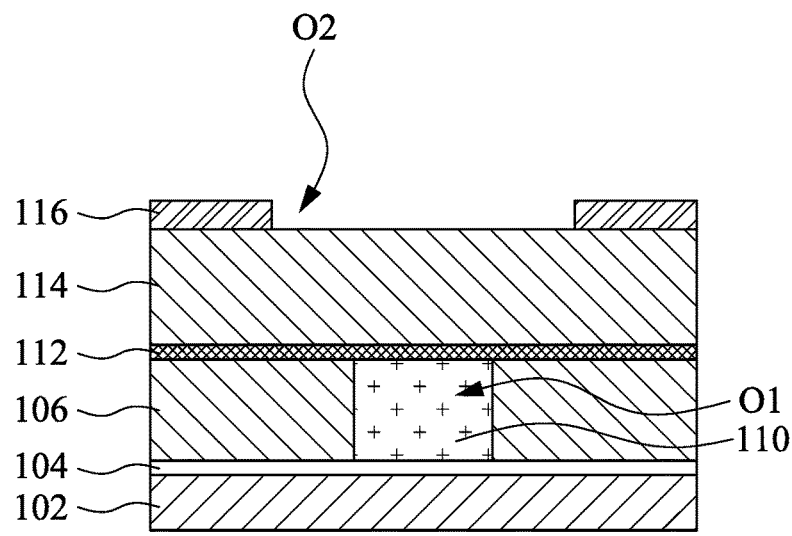

Reference is made to FIG. 7. The mask layer 116 is patterned to form a photoresist mask having an opening O2 exposing a portion of the second dielectric structure 114, so that an etching process can be performed to the exposed portion of the second dielectric structure 114 to form a trench opening in a later step. In some other embodiments, the mask layer 116 may be a hard mask, such as silicon nitride ($Si_3N_4$), which has relatively high etching resistivity compared to the second dielectric structure 114. Formation of the hard mask includes forming a hard mask layer on the second dielectric structure 114 and then patterned to form the hard mask with the image of the opening O2.

Figure 8:
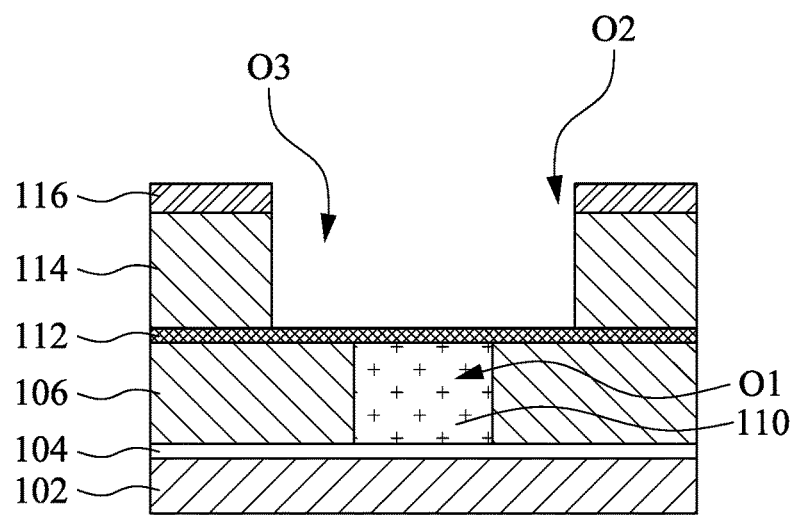

Reference is made to FIG. 8. A portion of the second dielectric structure 114 not covered by the mask layer 116 is removed to form a trench opening O3 in the second dielectric structure 114, and a portion of the etch stop layer 112 is exposed by the trench opening O3. The removal process can be an etching process, such as an anisotropic etching process. In other words, the second dielectric structure 114 is etched through to form the trench opening O3 that exposes the etch stop layer 112. The anisotropic etching process can be, for example, a $CF_4$ based or $C_4F_8$ based dry etching process. The etch stop layer 112 can protect the underlying first dielectric structure 106 against this etching process of forming the trench opening O3 because the etch stop layer 112 and the second dielectric structure 114 have different etch properties, and therefore, the etch stop layer 112 can prevent the underlying first dielectric structure 106 from over-etched, which may benefit the trench opening O3 formed in a suitable shape and depth. The mask layer 116 can protect the underlying portion of the second dielectric structure 114 against the etching process of forming the trench opening O3, so that the trench O3 can be formed with a pattern corresponding to the opening O2 of the mask layer 116. In other words, the mask layer 116 defines the pattern of the trench opening O3.

Figure 9:
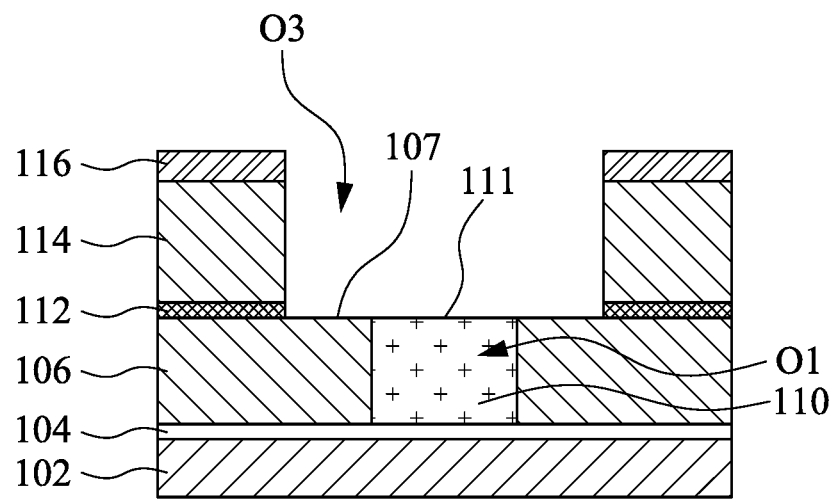

Reference is made to FIG. 9. A portion of the etch stop layer 112 exposed by the trench opening O3 is removed to expose portions of the top surfaces 107 and 111 of the first dielectric structure 106 and the dummy structure 110. For example, the portion of the etch stop layer 112 underlying the trench opening O3 can be removed by using a dry etching process, wet etching process, or combinations thereof. In some embodiments, the removal process is a wet etching process, and since the first dielectric structure 106 and the etch stop layer 112 have different etch properties, the etch stop layer 112 can be selectively etched with respect to the first dielectric structure 106, so that over-etching of the first dielectric structure 106 may be prevented from the etching process of removing the etch stop layer 112.

Figure 10:
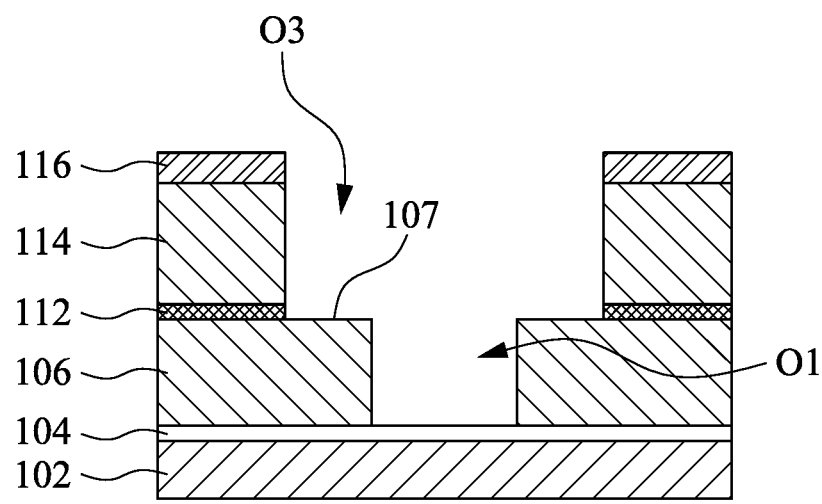

Reference is made to FIG. 10. The dummy structure 110 is removed to expose the via opening O1. This removal process may include an etching process, such as a wet etching process. During the wet etching process, since the dummy structure 110 and the first dielectric structure 106 have different etch properties, the dummy structure 110 can be selectively etched with respect to the first dielectric structure 106. Therefore, the shape or size of the via opening O1 may not be modified by the etching process of removing the dummy structure 110. Moreover, since the dummy structure 110 and the first dielectric structure 106 have different etch properties, the top surface 107 may not be recessed by the etching process of removing the dummy structure 110, so that the over-etching of the first dielectric structure 106 can be prevented. After this removal process, the via opening O1 is present between the trench opening O3 and the liner layer 104, and a width of the via opening O1 is less than a width of the trench opening O3. Stated differently, the first dielectric structure 106 may serve as a lower dielectric layer having the via opening O1 therein, and the second dielectric structure 114 may serve as an upper dielectric layer having the trench opening O3 therein. The etch stop layer 112 is present between the lower dielectric layer and the upper dielectric layer.

Figure 11:
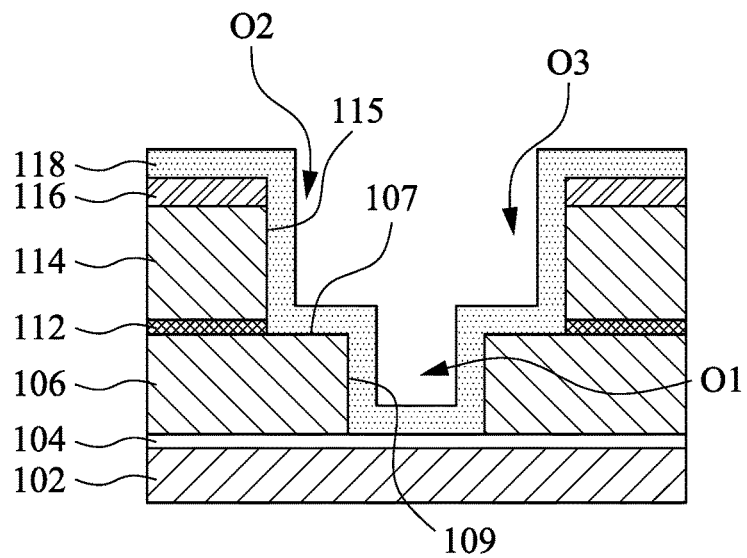

Reference is made to FIG. 11. A protective layer 118 is at least formed on a portion of the top surface 107 of the first dielectric structure 106 exposed by the trench opening O3. In particular, the protective layer 118 is conformally formed on a top surface of the mask layer 116, the exposed top surface 107 of the first dielectric structure 106, a top surface of the liner layer 104, an inner circumferential surfaces of the via opening O1, the opening O2 and the trench opening O3. In some embodiments, the protective layer 118 and the first dielectric structure 106 are made of different materials that have different etch properties and different adhesion abilities to a byproduct generated during a subsequent etching process performed to the liner layer 104. More particularly, the protective layer 118 may include a material having an etch selectivity different from the etch selectivity of the first dielectric structure 106. Moreover, the materials of the protective layer 118 and the first dielectric structure 106 are determined such that the adhesion ability of the protective layer 118 to the byproduct of etching the liner layer 104 is weaker than the adhesion ability of the first dielectric structure 106 to the byproduct of etching the liner layer 104. For example, the protective layer 118 may include a dielectric material, such as silicon nitride (SiN) or silicon oxynitride (SiON), and the first dielectric structure 106 may include tetrathoxysilane (TEOS), an extreme low-k (ELK) dielectric material, nitrogen-free anti-reflective coating (NFARC), or silicon oxide, which is different from the protective layer 118. During a subsequent etching process of removing a portion of the liner layer 104 between the via opening O1 and the non-insulator structure 102, the etch selectivity of the protective layer 118 is lower than the etch selectivity of the first dielectric structure 106, so that the protective layer 118 is not easier to be etched compared to the first dielectric structure 106, and therefore, the protective layer 118 can prevent the underlying first dielectric structure 106 from over-etched during the liner etching process. Moreover, since the adhesion ability of the protective layer 118 to the byproduct of etching the liner layer 104 is weaker than the adhesion ability of the first dielectric structure 106 to the byproduct of etching the liner layer 104, a portion of the protective layer 118 formed on a sidewall 109 of the via opening O1 can prevent the byproduct of etching the liner layer 104 adhered to the sidewall 109, so that a size of the via opening O1 is not reduced by the byproduct adhered to the sidewall 109. "Adhesion ability to the byproduct" in this context refers to the amount of the byproduct that can be adhered to per unit area of a surface. For example, "the adhesion ability of the protective layer 118 to the byproduct" refers to the amount of the byproduct that can be adhered to per unit area of a surface of the protective layer 118. Similarly, "the adhesion ability of the first dielectric structure 106 to the byproduct" refers to the amount of the byproduct that can be adhered to per unit area of a surface of the first dielectric structure 106.

Formation of the protective layer 118 may be performed by an atomic layer deposition (ALD) process or a CVD process. For example, the protective layer 118 may be a silicon nitride layer formed by ALD. The ALD for forming the silicon nitride layer includes multiple silicon nitride deposition cycles. Each silicon nitride deposition cycle may include contacting the top surface of the mask layer 116, the exposed top surface 107 of the first dielectric structure 106, the top surface of the liner layer 104, inner circumferential surfaces of the via opening O1, the opening O2 and the trench opening O3 with a silicon precursor, such that the silicon precursor adsorbs on these surfaces, and contacting these surfaces with a nitrogen precursor. The silicon nitride deposition cycle may be repeated as many times as to achieve a desired thickness and composition of a silicon nitride layer. This resulting silicon nitride layer serves as the protective layer 118. In some embodiments, the ALD process may benefit the control of the thickness of the protective layer 118 and thus benefit the control the critical dimension (CD) of the via opening O1 and/or the trench opening O3.

Figure 12:
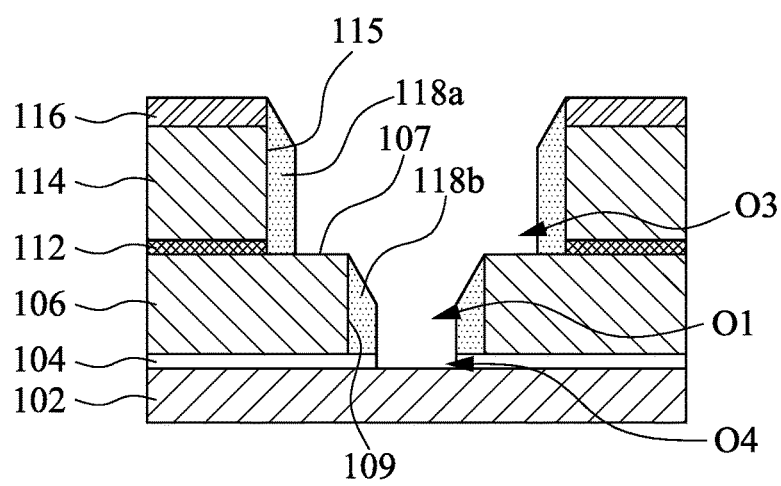

Reference is made to FIG. 12. A portion of the liner layer 104 underlying the via opening O1 is removed to form an opening O4, which allows the non-insulator structure 102 exposed by the via opening O1 and the opening O4. This removal process removes some portions of the protective layer 118 as well, and some portions of the protective layer 118 remain in the interconnection structure. In a greater detail, a remaining portion of the protective layer 118 serves as a first protective layer 118a that is present on at least one sidewall 115 of the trench opening O3, and another remaining portion of the protective layer 118 serves as a second protective layer 118b that is present on the side wall 109 of the via opening O1. Since the first and second protective layers 118a and 118b originate from the protective layer 118, the first and second protective layers 118a and 118b are made of substantially the same material, such as silicon nitride, silicon oxynitride or other suitable dielectric material. The first protective layer 118a on the sidewall 115 of the trench opening O3 may serve as a dielectric trench liner, and the second protective layer 118b on the sidewall 109 of the via opening O1 may serve as a dielectric via liner. In some embodiments, a portion of the liner layer 104 remains between the second protective layer 118b and the non-insulator structure 102 since the portion of the liner layer 104 is protected by the overlying second protective layer 118b during the liner etching process. In such a configuration, the second protective layer 118b and the non-insulator structure 102 are separated. More particularly, the second protective layer 118b and the non-insulator structure 102 are separated by the liner layer 104. In other words, a portion of the liner layer 104 is present between the second protective layer 118b and the non-insulator structure 102. Stated differently, the second protective layer 118b is adjacent to the liner layer 104. In some embodiments, the first protective layer 118a is present on the top surface 107 of the first dielectric structure 106 and covers a side surface of the etch stop layer 112.

In some embodiments, the portion of the liner layer 104 underlying the via opening O1 can be removed by using a dry etching process. The dry etching process may have a high selectivity such that the dry etching process may stop at the non-insulator structure 102. For example, the dry etching process may be performed under a source power of about 150 to 220 W, and a pressure of about 10 to 45 mTorr, using $CH_2F_2$ and Ar as etching gases. Unwanted etching of the non-insulator structure 102 may be reduced during the etching processes of forming the via and trench openings O1 and O3 due to the introduction of the liner layer 104 on the non-insulator structure 102. In a greater detail, the liner layer 104 may benefit forming a non-insulator structure 102 without a recess caused by the etching processes of forming the via and trench openings O1 and O3, thereby enhancing the device performance.

Since the liner etching process is performed after forming the protective layer 118, and the protective layer 118 and the first dielectric structure 106 have different etch properties, the protective layer 118 can protect the underlying portion of the first dielectric structure 106 from over-etched during the liner etching process. Further, since the liner etching process is performed after forming the protective layer 118, and the adhesion ability of the protective layer 118 to the byproduct of etching the liner layer 104 is weaker than the adhesion ability of the first dielectric structure 106 to the byproduct of etching the liner layer 104, the protective layer 118 formed on the sidewall 109 of the via opening O1 can prevent the byproduct of etching the liner layer 104 adhered to the sidewall 109 of the via opening O1, so that the size of the via opening O1 is not reduced by the byproduct adhered to the sidewall 109.

Figure 13:
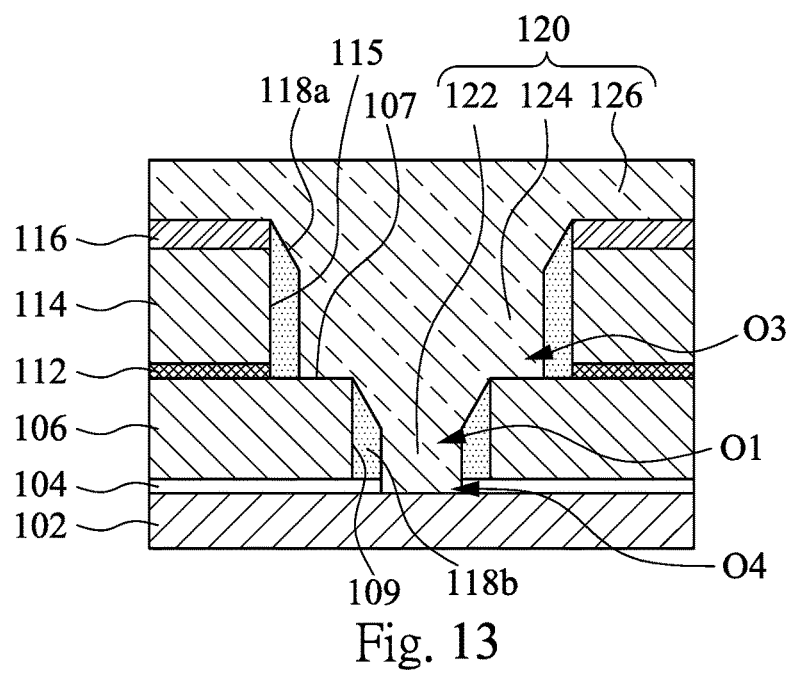

Reference is made to FIG. 13. A conductive structure 120 is at least formed in the via opening O1 and the trench opening O3 to electrically connect to the non-insulator structure 102 through the opening O4 of the liner layer 104. The first protective layer 118a is present between the conductive structure 120 and the sidewall 115 of the trench opening O3, and the second protective layer 118b is present between the conductive structure 120 and the sidewall 109 of the via opening O1. Since the etch stop layer 112 prevents the first dielectric structure 106 from over-etched during formation of the trench opening O3, and the protective layer 118 prevents the first dielectric structure 106 from over-etched during the etching process performed to the liner layer 104, the trench opening O3 may not be formed into the non-insulator structure 102 due to over-etching, so that the conductive structure 120 filling the trench opening O3 may not be formed in the non-insulator structure 102, which may prevent undesired electrical connections between the conductive structure 120 and the non-insulator structure 102. Further, since the second protective layer 118b prevents reduction of the size of the via opening O1 due to adhesion of the byproduct of etching the liner layer 104, a portion of the conductive structure 120 can be formed in the via opening O1 with a suitable size.

In some embodiments, the conductive structure 120 includes TiN, TaN, Ta, Ti, Hf, Zr, Ni, W, Co, Cu, or Al. In some embodiments, the conductive structure 120 may be formed by CVD, PVD, plating, ALD, or other suitable techniques. In some embodiments, the conductive structure 120 may include a laminate. The laminate may further include a barrier metal layer, a linear metal layer or a wetting metal layer. Further, the thickness of the conductive structure 120 depends on the depth of the via and trench openings O1 and O3. The conductive structure 120 is deposited until the via and trench openings O1 and O3 are substantially filled or over-filled.

In some embodiments, when the conductive structure 120 over-fills the trench opening O3, the conductive structure 120 may include a lower conductive portion 122, a middle conductive portion 124 and an upper conductive portion 126. The middle conductive portion 124 connects the lower conductive portion 122 and the upper conductive portion 126. The lower conductive portion 122 fills the via opening O1. In a greater detail, the lower conductive portion 122 is present in the via opening O1 and opening O4 of the liner layer 104 and on the second protective layer 118b. The lower conductive portion 122 may be formed with a suitable size due to the relative weak adhesion ability of the second protective layer 118b compared to the first dielectric structure 106. The middle conductive portion 124 is present in the trench opening O2 and on the first protective layer 118a. The middle conductive portion 124 may not be formed in the non-insulator structure 102 due to over-etching of the trench opening O3 because the etch stop layer 112 and the protective layer 118 protect the first dielectric structure 106 against over-etching.

In some embodiments, the middle conductive portion 124 of the conductive structure 120 and the etch stop layer 112 are arranged on the top surface 107 of the first dielectric structure 106 in a non-overlapping manner. In detail, the conductive structure 120 and the etch stop layer 112 are separated. In a greater detail, the first protective layer 118a present on the top surface 107 separates the etch stop layer 112 and the middle conductive portion 124 of the conductive structure 120. The overfilling portion of the conductive structure 120 forms the upper conductive portion 126 overlying the mask layer 116.

Figure 14:
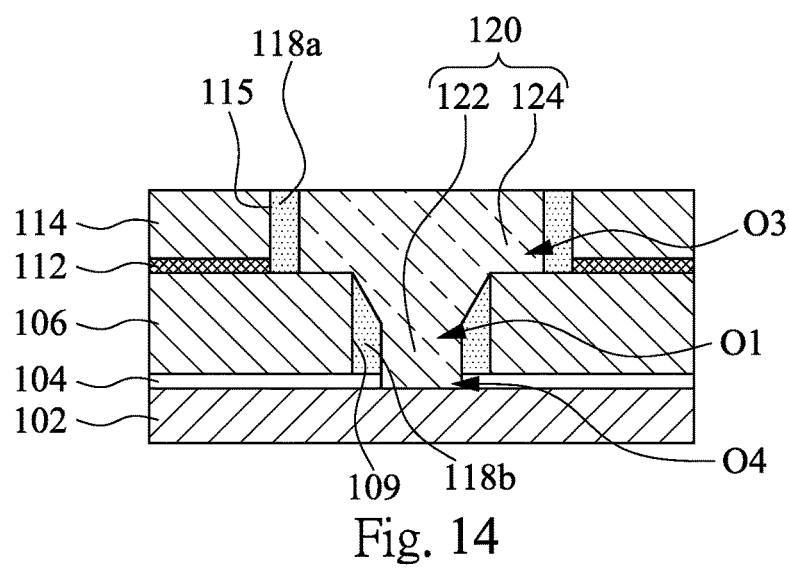

Reference is made to FIG. 14. A CMP process is performed to planarize the conductive structure 120 after filling the via and trench openings O1 and O3. The CMP process removes the upper conductive portion 126 of the conductive structure 120 outside the via and trench openings O1 and O3, and the CMP process may stop when reaching the second dielectric structure 114 and thus provide a substantially planar surface. The CMP process removes the mask layer 116.

In some embodiments, since the etch stop layer protects the first dielectric structure against the etching process of forming the trench opening O3, and the protective layer protects the first dielectric structure against the etching process of removing a portion of the liner layer, the first dielectric structure may not be over-etched. Moreover, since the protective layer prevents the byproduct of etching the liner layer from adhered to the sidewall of the via opening, the size of the via opening may not be reduced by the byproduct of etching the liner layer.

According to some embodiments of the present disclosure, an interconnection structure includes a non-insulator structure, a dielectric structure, a conductive structure and a first dielectric protective layer. The dielectric structure is present on the non-insulator structure. The dielectric structure has a trench opening and a via opening therein. The via opening is present between the trench opening and the non-insulator structure. The conductive structure is present in the trench opening and the via opening and electrically connected to the non-insulator structure. The first dielectric protective layer is present between the conductive structure and at least one sidewall of the trench opening.

According to some embodiments of the present disclosure, an interconnection structure includes a non-insulator structure, a liner layer, a dielectric structure, a dielectric via liner and a conductive structure. The liner layer is present on the non-insulator structure and has an opening therein. The dielectric structure is present on the liner layer. The dielectric structure includes a via opening therein. The via opening has at least one sidewall. The dielectric via liner is present on the sidewall of the via opening of the dielectric structure and adjacent to the liner layer. The conductive structure is present in the via opening and electrically connected to the non-insulator structure through the opening of the liner layer.

According to some embodiments of the present disclosure, a method of forming an interconnection structure includes forming a first dielectric structure on a non-insulator structure, forming a via opening in the first dielectric structure, forming a dummy structure in the via opening, forming an etch stop layer on the first dielectric structure and the dummy structure, forming a second dielectric structure on the etch stop layer, forming a trench opening in the second dielectric structure to expose a portion of the etch stop layer, removing the exposed portion of the etch stop layer to expose at least the dummy structure, removing the dummy structure in the via opening, and forming a conductive structure in the trench opening and the via opening. The conductive structure is electrically connected to the non-insulator structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interconnection structure, comprising:
   a non-insulator structure;
   a first dielectric layer over the non-insulator structure, the first dielectric layer having a via opening therein;
   a second dielectric layer over the first dielectric layer, the second dielectric layer having a trench opening in communication with the via opening;
   an etch stop layer between the second dielectric layer and the first dielectric layer;
   a conductive structure present in the trench opening and the via opening and electrically connected to the non-insulator structure, the conductive structure being in contact with a portion of a top surface of the first dielectric layer; and
a first dielectric protective layer present between the conductive structure and at least one sidewall of the via opening, the first dielectric protective layer being separated from the etch stop layer.

2. The interconnection structure of claim 1, wherein the first dielectric protective layer and the second dielectric layer have different etch properties.

3. The interconnection structure of claim 1, further comprising:
a second dielectric protective layer present between the conductive structure and at least one sidewall of the trench opening.

4. The interconnection structure of claim 3, wherein the first dielectric protective layer and the second dielectric protective layer are made of substantially the same material.

5. The interconnection structure of claim 1, wherein the first dielectric protective layer and the non-insulator structure are separated.

6. The interconnection structure of claim 1, further comprising:
a liner layer present between the non-insulator structure and the first dielectric layer, wherein the first dielectric protective layer and the non-insulator structure are separated by the liner layer.

7. The interconnection structure of claim 6, wherein the first dielectric protective layer has an adhesion ability to a byproduct of etching the liner layer weaker than that of the first dielectric layer.

8. The interconnection structure of claim 1, wherein the first dielectric protective layer and the first dielectric layer have different etch properties.

9. An interconnection structure, comprising:
a non-insulator structure;
a liner layer present on the non-insulator structure and having an opening therein;
a first dielectric layer present on the liner layer, the first dielectric layer comprising a top surface and a via opening in the top surface, the via opening having at least one sidewall;
an etch stop layer over the top surface of the first dielectric layer;
a dielectric via liner present on the sidewall of the via opening of the first dielectric layer, the dielectric via liner being separated from the etch stop layer; and
a conductive structure present in the via opening and electrically connected to the non-insulator structure through the opening of the liner layer.

10. The interconnection structure of claim 9, wherein the dielectric via liner and the first dielectric layer have different etch properties.

11. The interconnection structure of claim 9, wherein the dielectric via liner and the first dielectric layer are made of different materials having different adhesion properties.

12. The interconnection structure of claim 9, wherein the dielectric via liner has an adhesion ability to a byproduct of etching the opening of the liner layer weaker than that of the first dielectric layer.

13. The interconnection structure of claim 9, further comprising:
a second dielectric layer over the etch stop layer, the second dielectric layer having at least one trench opening communicating with the via opening; and
a dielectric trench liner present on at least one sidewall of the trench opening of the second dielectric layer.

14. The interconnection structure of claim 13, wherein the dielectric trench liner and the second dielectric layer have different etch properties.

15. An interconnection structure, comprising:
a non-insulator structure;
a first dielectric structure present on the non-insulator structure;
a second dielectric structure present on the first dielectric structure;
an etch stop layer present between the first dielectric structure and the second dielectric structure;
a conductive structure penetrating through the first dielectric structure and the second dielectric structure and electrically connected to the non-insulator structure; and
a dielectric via liner present between the first dielectric structure and the conductive structure, wherein the dielectric via liner is separated from the etch stop layer.

16. The interconnection structure of claim 15, wherein the etch stop layer and the first dielectric structure have different etch properties.

17. The interconnection structure of claim 15, wherein the etch stop layer and the second dielectric structure have different etch properties.

18. The interconnection structure of claim 15, further comprising a dielectric trench liner present between the conductive structure and the second dielectric structure, wherein the dielectric trench liner is further present between the etch stop layer and the conductive structure.

19. The interconnection structure of claim 15, wherein the etch stop layer and a portion of the conductive structure are arranged on a top surface of the first dielectric structure in a non-overlapping manner.

20. The interconnection structure of claim 15, further comprising a dielectric trench liner present between the conductive structure and the second dielectric structure, wherein the conductive structure and the dielectric trench liner are in contact with a same surface of the first dielectric structure.

* * * * *